United States Patent [19]

Kilichowski

[11] 4,397,939

[45] Aug. 9, 1983

[54] METHOD OF USING A POSITIVE ELECTRON BEAM RESIST MEDIUM

[75] Inventor: Kurt B. Kilichowski, Mercerville, N.J.

[73] Assignee: RCA Corporation, New York, N.Y.

[21] Appl. No.: 330,579

[22] Filed: Dec. 14, 1981

[51] Int. Cl.³ .............................................. G03C 5/00
[52] U.S. Cl. .................................... 430/296; 430/313; 430/327; 430/276; 204/159.14; 204/159.2; 528/364
[58] Field of Search ..................... 528/364; 204/159.2, 204/159.14; 430/296, 311, 313, 276, 327

[56] References Cited

U.S. PATENT DOCUMENTS

| | | | |
|---|---|---|---|
| 3,893,127 | 7/1975 | Kaplan et al. | 346/1 |
| 3,898,350 | 8/1975 | Gipstein et al. | 427/43 |
| 3,931,435 | 1/1976 | Gipstein et al. | 427/43 |
| 3,935,331 | 1/1976 | Poliniak et al. | 427/43 |
| 3,935,332 | 1/1976 | Poliniak et al. | 427/43 |
| 4,153,741 | 5/1979 | Poliniak et al. | 427/38 |
| 4,215,035 | 7/1980 | Memering et al. | 260/45.75 W |
| 4,341,861 | 7/1982 | Pampalone | 430/296 |

OTHER PUBLICATIONS

Chemical Abstract 85: 78465e, "Mechanism of Alternating Copolymerization of Sulfur Dioxide With Donor Monomers", Stoyachenko, I. L.

J. of Polymer Sci., Polymer Physics Edition, vol. 11, 1713–1721, (1973).

*Primary Examiner*—Jack P. Brammer
*Attorney, Agent, or Firm*—Birgit E. Morris; R. Hain Swope

[57] ABSTRACT

This invention relates to novel terpolymers of vinyl acetate, 3-methylcyclopentene and sulfur dioxide. Positive electron beam resist media prepared from the subject terpolymers possesses excellent sensitivity and development latitude.

11 Claims, No Drawings

METHOD OF USING A POSITIVE ELECTRON BEAM RESIST MEDIUM

This invention relates to novel poly(olefin sulfone) terpolymers useful as positive resist recording media in the manufacture of electronic devices including microelectronic circuits.

BACKGROUND OF THE INVENTION

Significant advances in recent years in the reduction in physical size and cost of electronic components have resulted from improvements in techniques for the manufacture of microelectronic circuits, e.g. microlithography. Microlithography, generally, comprises applying a film of a radiation-sensitive polymeric material, i.e. a resist medium, to one surface of a substrate, irradiating certain portions of the film with, e.g. ultraviolet light, electron beam, X-ray or the like, and developing the film with a solvent to remove solubilized portions thereof. In the instance of a positive resist, irradiation causes the resist medium to become more soluble in the developer solvent. The resist medium remaining on the surface of the substrate is then employed as a protective mask to facilitate the selective etching or other treatment of the exposed portions of the substrate.

Etching of the substrate may be conventionally carried out by chemical treatment or by plasma discharge. Plasma etching is advantageous because of finer resolution and freedom from pollution and handling problems inherent in the use of chemical etchants. Many resist materials, however, cannot withstand plasma discharge and are eroded along with the substrate resulting in loss of pattern resolution. Therefore, chemical etching is more commonly used in spite of its obvious disadvantages of poorer resolution, posing a pollution threat and being potentially hazardous to operating personnel.

Poly(olefin sulfone) polymers are a major class of such positive resists. Of the large number of poly(olefin sulfone) resist media reported in the literature, however, only one, i.e. poly(1-butene sulfone), is commercially available. Although possessing acceptable sensitivity, this material is disadvantageous in that: it does not adhere well to certain substrates, particularly chromium; it must be irradiated at an electron beam dose of 1 $\mu$/cm$^2$ which is at or near the capacity of many installations; and it has poor resistance to plasma etching.

There is a continuing search for polymeric materials with increased sensitivity to irradiation to achieve higher resolution in answer to the demand for ever-finer circuitry. In accordance with this invention, there is provided a positive electron beam recording media which possesses increased sensitivity and development latitude and which has none of the above disadvantages.

SUMMARY OF THE INVENTION

In accordance with this invention, there are provided novel poly(olefin sulfone) terpolymers suitable for the preparation of positive electron beam resist recording media.

DETAILED DESCRIPTION OF THE INVENTION

The positive resist medium in accordance with the present invention is comprised of terpolymers of vinyl acetate, 3-methylcyclopentene and sulfur dioxide. The terpolymers of this invention comprise the monomer component, i.e. vinyl acetate and 3-methylcyclopentene, and sulfur dioxide in a 1 to 1 molar ratio. The monomer component comprises from about 50 mole percent to about 90 mole percent, preferably about 75 mole percent, of vinyl acetate and from about 10 mole percent to about 50 mole percent, preferably about 25 mole percent, of 3-methylcyclopentene. The poly(olefin sulfone) terpolymers of this invention can be prepared in a conventional manner by free radical polymerization of the monomer components and sulfur dioxide in the presence of a conventional polymerization initiator such as, for example, t-butylhydroperoxide. The molecular weight of the terpolymer is controlled by the amount of polymerization initiator present with increased amounts giving lower molecular weights.

The molecular weight of the subject terpolymers should be sufficiently high so that, when areas of resist medium film formed therefrom are irradiated, there will be a sufficient reduction in molecular weight to cause a significant difference in the relative solubility of the irradiated and non-irradiated portions of the film. The molecular weight of the subject terpolymers is further important in terms of their solubility in the solvents used for casting resist medium films. In general, the novel terpolymers of this invention have a weight average molecular weight ($M_w$) of from about 300,000 to about 1,200,000, preferably from about 400,000 to about 700,000 and a molecular weight distribution ($M_w/M_n$) of less than 4, preferably about 3.3, wherein $M_n$ equals number average molecular weight.

In order to apply the terpolymers of this invention to a substrate, the terpolymer is initially dissolved in a suitable organic solvent. The resulting solution is then coated on the substrate in a conventional manner, e.g. by casting, spraying, spin coating and the like. The solution usually contains from about 4 to about 10 percent by weight, preferably from about 6 to about 8 percent by weight, of the terpolymer. Suitable organic solvents preferably have low boiling points, thus permitting ready removal of the solvent from the coating by heat and/or vacuum drying. Removal of the solvents should form a uniform resist recording medium film of the terpolymer on the substrate. Examples of suitable solvents for the novel terpolymers of this invention include 2-methoxyethyl acetate, cyclopentene and chlorobenzene, with the former being preferred.

The recording medium films are formed on the substrate in various thicknesses, generally from about 0.1 micron to about 5 microns, depending on the intended use of the recording media. It is preferred to bake the film in air or under vacuum, usually at a temperature above the glass transition temperature of the terpolymer, but below its thermal decomposition point. The baking removes traces of solvent and anneals out stresses and strains in the film.

Portions of the recording medium films of this invention are selectively irradiated with, e.g. electron beam, modulated electron beam or X-ray, thereby causing degradation of the terpolymer in the irradiated areas. The specific explosure flux will normally depend on the thickness of the resist medium coating. Generally, for exposure of a resist medium film having a thickness of from about 0.1 micron to about 5 microns, electron beam radiation from about 0.2 microcoulomb/cm$^2$ to about 10 microcoulomb/cm$^2$ is utilized. For preferred films having a thickness of between about 0.5 to about 1 micron, radiation from about 0.5 to about 0.6 microcoulomb/cm$^2$ is utilized.

When utilized as positive working etch resists, films of the terpolymers of this invention are cast to a thickness equal to or less than the depth of penetration of the electron beam, thus exposing the substrate upon development. Alternatively, the terpolymers of this invention can be employed as media for recording of surface relief patterns by exposing thicker films to well-defined patterns which, upon development, correspond in relief to the information recorded.

The irradiated film may be developed utilizing a solvent which will dissolve both the irradiated and non-irradiated portions, but will dissolve the irradiated portion more rapidly. Utilizing this method, the thickness of the resist film will be adjusted so that, after development, there will be sufficient film remaining in the non-irradiated areas to protect the underlying substrate during subsequent operations such as etching. Development may also be carried out utilizing a solvent which exclusively dissolves the irradiated portion of the film. This technique tends to give sharper resolution, but generally requires longer and more careful developing than the use of a common solvent.

It is preferred in accordance with this invention to develop the irradiated films of the subject terpolymer with the combination of a solvent for both the irradiated and non-irradiated portions of the film and a compatible non-solvent therefor. Suitable solvents for the films of the subject terpolymers include, for example, ketones such as methylethyl ketone, 2-methylcyclohexanone, and the like. Compatible non-solvents are usually alcohols such as, for example, 2-methylcyclohexanol. However, methylisobutyl ketone is a preferred non-solvent for the subject terpolymer and is utilized in combination with methylethyl ketone.

The formulation of such solvent/non-solvent combinations which will fully develop irradiated portions of the resist films while eroding only a portion of the non-irradiated film is conventional in the art. In such systems, the effect of the non-solvent is to retard the developing action of the solvent thereby affording more carefully controlled development.

As stated above, one of the primary advantages of the terpolymers of this invention is significantly improved development latitude. The resist medium films formed from the subject terpolymers may be developed for from about 30 seconds to about 5 minutes, preferably from about 1 to about 3 minutes. In a like manner, the temperature at which the subject films are developed can vary within a rather wide range. Generally, however, temperatures from about 20° C. to about 27° C., preferably from about 22° C. to about 25° C. are contemplated.

The recording media of this invention may, after removal of the irradiated portion, i.e. after development, provide a pattern on the substrate which is used conventionally as a guide for the formation of circuits and the like. The substrates which may be advantageously so treated include, for example, plastic or plastic laminates, porcelain-coated metals such as steel or steel alloys, ceramic wavers, chrome- or nickel-coated glass and the like on which it is desired to form a microelectronic circuit. Wherein portions of the substrate have been exposed by development, the desired pattern is formed thereby by the use of the conventional etchant therefor, e.g. ferric chloride solutions for steel, hydrofluoric acid solutions for glass and the like.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

Part A

A reaction tube equipped with a mechanical stirrer was cooled to $-60°$ with a dry ice/isopropanol mixture. Under constant temperature, a solution of 7.5 gm of vinyl acetate, 2.5 gm of 3-methylcyclopentene, and 0.1 ml. of t-butylhydroperoxide was added dropwise to 30 ml of liquid sulfur dioxide with constant stirring under a nitrogen blanket. After the addition of the solution was completed, the excess sulfur dioxide was allowed to boil off and the residue was dissolved in 100 ml of tetrahydrofuran. The resulting solution was poured slowly into 500 ml of methanol with agitation to precipitate the terpolymer product. The precipitated product was collected and vacuum dried overnight in an oven at 40° (yield approximately 70 percent). The resulting terpolymer was shown by quantitative infrared spectroscopy to be 75/25/100 vinyl acetate/3-methylcyclopentene/sulfur dioxide.

Part B

A sufficient amount of the thus-formed terpolymer was dissolved in 2-methoxyethyl acetate to yield a 6 percent solution. The resulting solution was spin-coated on chrome/glass substrates and dried to form films 0.5 micrometer thick. The films were baked for 35 minutes at 95° and allowed to stand 24 hours at room temperature. Fine-line exposure patterns were generated in the films using a modified Cambridge Stereoscan SEM employing computer programmed e-beam modulation to produce a test pattern.

For comparative purposes, 0.5 micrometer thick films of copolymers of sulfur dioxide with 3-methylcyclopentene and with vinyl acetate, respectively, were prepared.

The films were exposed to various doses of modulated electron beam radiation. Fine-line patterns were achieved for the terpolymers of Part A in the dosage range of 0.5 to 0.6 microcoulombs/$cm^2$. This represents an improvement of 1.5 to 2 times sensitivity in comparison with the copolymer of 3-methylcyclopentene and sulfur dioxide. The copolymer of vinyl acetate and sulfur dioxide demonstrated a sensitivity approximating that of the terpolymer of Part A.

Utilizing a 1 to 1 mixture of methylethyl ketone and methylisobutyl ketone, the film of the terpolymer of Part A was developed in from 2 to 3 minutes. Utilizing a 60:40 mixture of 2-methylcyclohexanone and 2-methylcyclohexanol, a comparable development was obtained in from 1 to 2 minutes. There was virtually no surface erosion on any of the samples of the terpolymer.

The copolymer of 3-methylcyclopentene and sulfur dioxide showed only slight surface erosion in non-irradiated areas utilizing the above developers in the same times.

The copolymer of vinyl acetate and sulfur dioxide showed significantly increased surface erosion in non-irradiated areas with the above developers in the above development times, i.e. 1 to 3 minutes. The surface, however, remained intact without development of pinholes or loss of adhesion to the substrate.

Therefore, the subject terpolymer is clearly superior to the copolymer of 3-methylcyclopentene and sulfur dioxide in terms of development latitude and sensitivity and to the copolymer of vinyl acetate and surfur dioxide in degree of surface erosion by the developer in non-irradiated areas.

I claim:

1. In a method of forming a patterned layer on a substrate comprising:
   (a) coating said substrate with a composition comprising a positive acting polymeric resist material and a suitable solvent therefor;
   (b) drying said coating to form a positive recording medium;
   (c) irradiating selected portions of said medium with an electron beam, a modulated electron beam or x-ray; and
   (d) developing the irradiated portions of said medium with a suitable developer, the improvement comprising utilizing as the resist material a terpolymer comprising a monomer component and sulfur dioxide in a 1:1 molar ratio, said monomer component comprising from about 10 mole percent to about 50 mole percent of 3-methylcyclopentene and from about 50 mole percent to about 90 mole percent of vinyl acetate, said terpolymer having a molecular weight of from about 300,000 to about 1,200,000.

2. A method in accordance with claim 1, wherein the composition contains from about 4 to about 10 percent by weight of said terpolymer.

3. A method in accordance with claim 2, wherein said solvent is 2-methoxyethylacetate.

4. A method in accordance with claim 1, wherein said medium is irradiated with an electron beam.

5. A method in accordance with claim 1, wherein said medium is irradiated with a modulated electron beam.

6. A method in accordance with claim 1, wherein said medium is baked prior to irradiation.

7. A method in accordance with claim 1, wherein said development exposes corresponding portions of the substrate.

8. A method in accordance with claim 7, additionally including etching the exposed substrate with a suitable etchant.

9. A method in accordance with claim 8, wherein said substrate is chromium coated on glass.

10. A method in accordance with claim 1, wherein said developer is a mixture of methylethyl ketone and methylisobutyl ketone.

11. A method in accordance with claim 1, wherein said developer is a mixture of 2-methylcyclohexanone and 2-methylcyclohexanol.

* * * * *